United States Patent
Yan et al.

(10) Patent No.: US 10,503,081 B2
(45) Date of Patent: Dec. 10, 2019

(54) CARRYING PLATFORM AND EXPOSURE METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Chunlong Yan, Beijing (CN); Jianjun Li, Beijing (CN); Xin Bai, Beijing (CN); Guiqi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/790,775

(22) Filed: Oct. 23, 2017

(65) Prior Publication Data
US 2018/0275531 A1    Sep. 27, 2018

(30) Foreign Application Priority Data
Mar. 27, 2017    (CN) .......................... 2017 1 0190148

(51) Int. Cl.
| | | |
|---|---|---|
| G03B 27/58 | (2006.01) | |
| G03F 7/20 | (2006.01) | |
| B24B 41/06 | (2012.01) | |
| H01L 21/68 | (2006.01) | |
| H01L 21/67 | (2006.01) | |

(52) U.S. Cl.
CPC ........ *G03F 7/70725* (2013.01); *B24B 41/068* (2013.01); *G03F 7/707* (2013.01); *G03F 7/70783* (2013.01); *H01L 21/6719* (2013.01); *H01L 21/68* (2013.01); *G03F 7/70758* (2013.01); *G03F 7/70775* (2013.01)

(58) Field of Classification Search
CPC .. G03F 7/707; G03F 7/70725; G03F 7/70758; G03F 7/70775; G03F 7/70783; B24B 41/068; H01L 21/0274; H01L 21/68
See application file for complete search history.

(56) References Cited

U.S. PATENT DOCUMENTS 5,563,684 A * 10/1996 Stagaman .............. G03B 27/58
355/47
2006/0103827 A1  5/2006 Derksen
(Continued)

FOREIGN PATENT DOCUMENTS

| CN | 101226343 A | 7/2008 |
| CN | 105629673 A | 6/2016 |

(Continued)

OTHER PUBLICATIONS

The Second Chinese Office Action dated Jul. 6, 2018; Appln. No. 201710190148.X.
(Continued)

*Primary Examiner* — Peter B Kim
(74) *Attorney, Agent, or Firm* — Ladas & Parry LLP

(57) ABSTRACT

A carrying platform and an exposure method are provided. The carrying platform includes: a plurality of sub-stands, configured to co-carry an object. Each sub-stand includes: a platform having a first carrying surface; and a position adjusting unit disposed on a side of the platform away from the first carrying surface and configured to adjust at least one of height or inclined angle of the platform.

18 Claims, 6 Drawing Sheets

(56) References Cited

U.S. PATENT DOCUMENTS

2009/0244511 A1* 10/2009 Hyde .................... G03F 7/7035
　　　　　　　　　　　　　　　　　　　　355/75
2013/0014360 A1　　1/2013 Inanami et al.
2016/0370712 A1* 12/2016 Shibazaki ......... H01L 21/68742

FOREIGN PATENT DOCUMENTS

| | | |
|---|---|---|
| CN | 105629674 A | 6/2016 |
| CN | 105629675 A | 6/2016 |
| JP | 2010-205553 A | 9/2010 |

OTHER PUBLICATIONS

The First Chinese Office Action dated Nov. 16, 2017; Appln. No. 201710190148.X.

* cited by examiner

CARRYING PLATFORM AND EXPOSURE METHOD

The application claims priority to the Chinese patent application No. 201710190148.X, filed Mar. 27, 2017, the present disclosure of which is incorporated herein by reference as part of the application.

TECHNICAL FIELD

Embodiments of the present disclosure relate to a carrying platform and an exposure method.

BACKGROUND

A photolithograph process is one of most important processes in a semiconductor manufacturing process. Precision and accuracy of the photolithograph process play a very important role on the size, precision and yield of a manufactured chip or substrate. A general photolithograph manufacturing process includes placing an object to be exposed on a carrying platform; placing a mask above the object to be exposed; and exposing the object to be exposed by the mask.

SUMMARY

An embodiment of the present disclosure provides a carrying platform, including: a plurality of sub-stands, configured to co-carry an object; wherein each sub-stand includes: a platform, having a first carrying surface: and a position adjusting unit, disposed on a side of the platform away from the first carrying surface and configured to adjust at least one of a height or inclined angle of the platform.

For example, in the carrying platform provided by embodiment of the present disclosure, each sub-stand further includes: at least one distance detecting unit, disposed on the platform.

For example, the carrying platform provided by embodiment of the present disclosure further includes: a control unit, in communication with the position adjusting units of the respective plurality of sub-stands: wherein the control unit is configured to control the position adjusting unit of the respective sub-stands.

For example, the carrying platform provided by embodiment of the present disclosure further includes: a worktable, wherein the plurality of sub-stands are disposed on the worktable in array.

For example, in the carrying platform provided by embodiment of the present disclosure, in a plan view of the carrying platform, a distance between adjacent sub-stands is smaller than $1/10$ of a size of the first carrying surface of each sub-stand in a direction.

For example, in the carrying platform provided by embodiment of the present disclosure, in a plan view of the carrying platform, the first carrying surfaces of the plurality of sub-stands form a second carrying surface, and a size of the second carrying surface is larger than 1 $m^2$.

For example, in the carrying platform provided by embodiment of the present disclosure, the position adjusting unit includes: at least one platform lift mechanism, configured to be lift up and down to adjust at least one of height or inclined angle of the platform.

For example, in the carrying platform provided by embodiment of the present disclosure, the at least one platform lift mechanism includes two or more platform lift mechanisms, disposed on an edge of the platform, wherein, the two or more platform lift mechanisms are operable independently.

For example, in the carrying platform provided by embodiment of the present disclosure, the at least one platform lift mechanism includes an air cylinder.

For example, in the carrying platform provided by embodiment of the present disclosure, the at least one platform lift mechanism includes: a fixing part, fixedly disposed on a side of the platform away from the first carrying surface; a rotary mechanism, including a rotary shaft; a connecting rod; a roller, having a bearing; wherein the rotary mechanism is disposed on the fixing part, one end of the connecting rod is fixedly connected to the rotary shaft and configured to move along an arc line along with the rotary shaft, and the other end of the connecting rod is fixedly connected to the bearing.

For example, in the carrying platform provided by embodiment of the present disclosure, the rotary mechanism includes an electromotor.

Another embodiment of the present disclosure provides an exposure method, including: providing a carrying platform including a plurality of sub-stands, wherein, at least one of height or inclined angle of each sub-stand is adjustable; placing an object to be exposed on the plurality of sub-stands; disposing a mask on a side of the object to be exposed away from the carrying platform; and adjusting at least one of the sub-stands to adjust a gap between the mask and a portion of the object to be exposed.

For example, in the exposure method provided by the embodiment of the present disclosure, the adjusting at least one of the sub-stands to adjust a gap between the mask and a portion of the object to be exposed includes: measuring the gaps between the mask and portions of the object to be exposed which are located at measuring positions respectively; and adjusting at least of height or inclined angle of the at least one of the sub-stands to enable a difference value between the gaps between the mask and the portions of the object to be exposed which are located at adjacent two of the measuring positions to be smaller than 20 μm, and to enable a difference value between the gaps between the object to be exposed and the mask at all the measuring positions to be smaller than 40 μm.

For example, the exposure method provided by the embodiment of the present disclosure further includes: performing an exposure with the mask; measuring a deviation value of a exposure pattern formed on the object to be exposed after the exposure; calculating an adjusting corrected value of the at least one of the sub-stands according to the deviation value; and adjusting at least one of height or inclined angle of the at least one of the sub-stands according to the adjusting corrected value to improve uniformity of the gaps between the mask and the respective portions of the object to be exposed.

For example, the exposure method provided by the embodiment of the present disclosure further includes: recording an adjusting value of the plurality of sub-stands before performing the exposure with the mask; recording the adjusting corrected value; and respectively exposing a plurality of objects belonging to a same batch as the object to be exposed according to the adjusting value and the adjusting corrected value.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
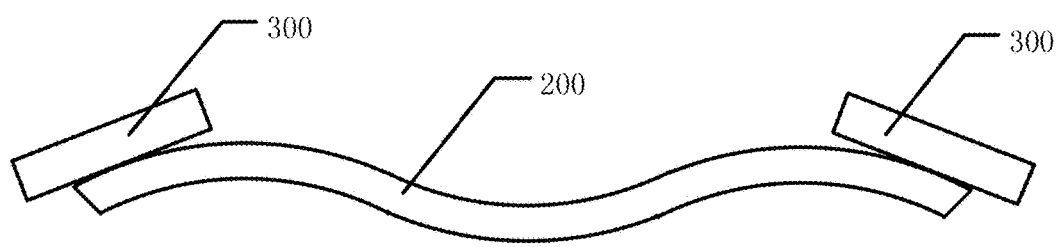
FIG. 1 is a schematic diagram of loading a mask on an exposure machine.
Figure 2:
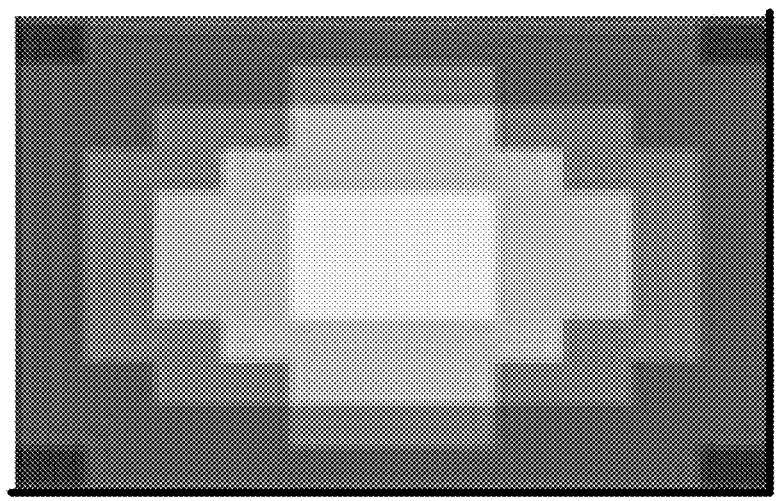
FIG. 2 is a diagram of a distribution result of critical dimensions of an exposure unit.
Figure 3:
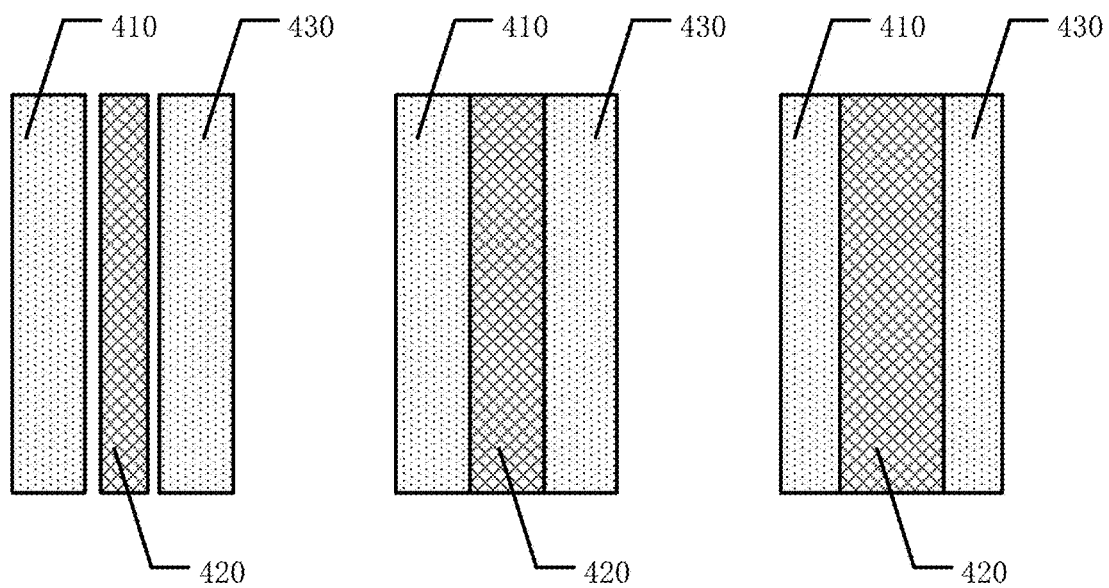
FIG. 3 is a schematic diagram of green filter patterns of different critical dimensions in a color filter substrate.

It is found that in a photolithograph process, an exposure gap between a mask and an object to be exposed have a larger influence on an exposure result; besides, relevance between the exposure gap and Critical Dimensions (CD) is more obvious. FIG. 1 shows a schematic diagram of loading the mask on an exposure machine; as shown in FIG. 1, holders 300 are adsorbed to two ends of a mask 200 in a manner of vacuum adsorption; however, due to the gravity of the mask 200 per se, the mask 200 is bent to a certain extent; as a result, the problem of nonuniform critical dimensions of exposed patterns is caused. FIG. 2 shows a distribution result diagram of the critical dimensions of an exposure unit, as shown in FIG. 2, the critical dimensions of four corners of the exposure unit are larger, while the critical dimension of a central region is smaller, and thus poor uniformity of the critical dimensions of such exposure unit is caused. Besides, different exposure gaps will lead to various defects of the formed exposure patterns; for example, as shown in FIG. 3, in the manufacturing process of green filter patterns of a color filter substrate, if the critical dimensions of the green filter patterns 420 are smaller, then the green filter patterns 420, red filter patterns 410 and blue filter patterns 430 cannot totally cover the whole color filter substrate, which will cause a light leakage risk; if the critical dimensions of the green filter patterns 420 are larger, then the green filter patterns 420 will overlap with the red filter patterns 410 or the blue filter patterns 430, which will cause a color mixing risk. Therefore, it is favorable to improve product yield by controlling the exposure gaps between the mask and the object to be exposed (for example, a substrate to be exposed) and by improving the uniformity of the exposure gaps at different positions of the object to be exposed.

Embodiments of the present disclosure provide a carrying platform and an exposure method. The carrying platform includes a plurality of sub-stands. The plurality of sub-stands are configured to co-carry an object (for example, an object to be exposed), each sub-stand includes a platform having a first carrying surface and a position adjusting unit, and the position adjusting unit is disposed on a side of the platform away from the first carrying surface and capable of adjusting a height and/or an inclined angle of the platform. Therefore, the carrying platform is a novel carrying platform, and can be used to adjust the exposure gaps at different positions of the object to be exposed.

The carrying platform and the exposure method provided by the embodiments of the present disclosure are explained in combination with the drawings.

Embodiment 1

Figure 4:
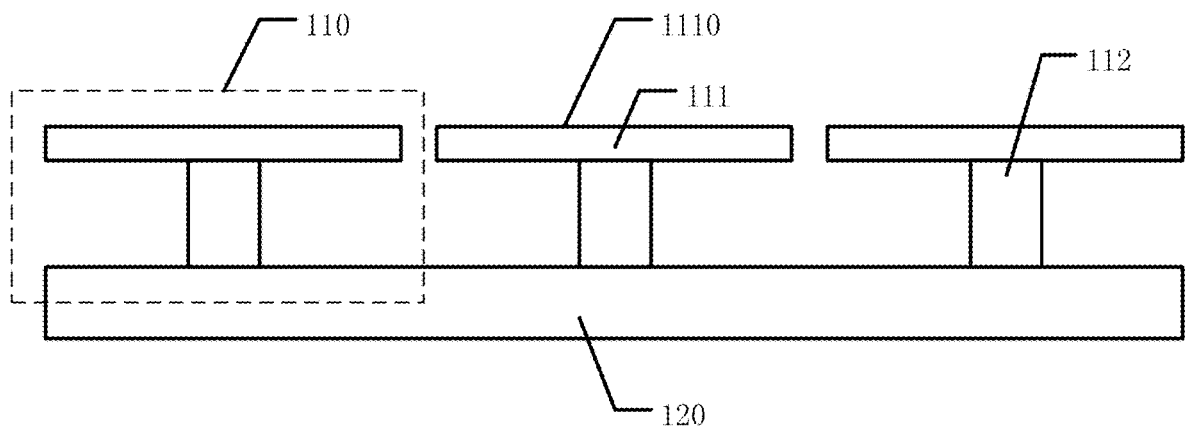
FIG. 4 is a structural schematic diagram of a carrying substrate provided by an embodiment of the present disclosure.

The present embodiment provides a carrying platform. FIG. 4 shows a structural schematic diagram of the carrying platform provided by the present embodiment; as shown in FIG. 4, such carrying platform includes a plurality of sub-stands 110, and the plurality of sub-stands 110 can co-carry an object, for example, an object to be exposed. Each sub-stand 110 includes a platform 111 having a first carrying surface 1110 and a position adjusting unit 112 disposed on a side of the platform 111 away from the first carrying surface 1110, and the position adjusting unit 112 can adjust a height and/or an inclined angle of the platform 111. For example, the plurality of sub-stands can be used to adjust gaps between the object to be exposed and the mask at different positions of the object to be exposed.

In the carrying platform provided by the present embodiment, the plurality of sub-stands can co-carry the object to be exposed, that is, the object to be exposed can be simultaneously disposed on the first carrying surfaces of the plurality of sub-stands. Since the position adjusting units can adjust the heights and/or inclined angles of the platforms, the heights and/or inclined angles at different positions of the object to be exposed can be adjusted by the position adjusting units of the sub-stands corresponding to the positions, that is, the heights and/or inclined angles at different positions of the object to be exposed can be adjusted by a plurality of sub-stands. Hence, the heights and/or inclined angles at different positions of the object to be exposed can be adjusted to match with deformation, caused by gravity, of the mask disposed above the object to be exposed, thereby improving the uniformity of the exposure gaps at different positions of the object to be exposed, and further improving an exposure precision and the yield of an exposure product.

Figure 5A:
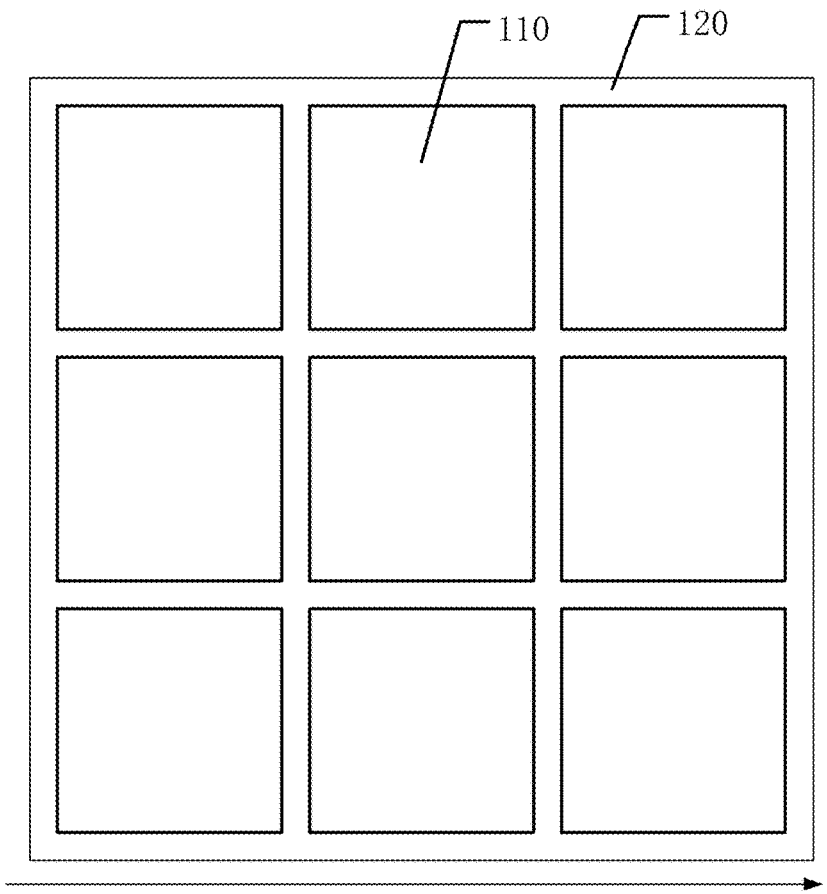
FIG. 5a is a planar schematic diagram of a carrying substrate provided by an embodiment of the present disclosure.
Figure 5B:
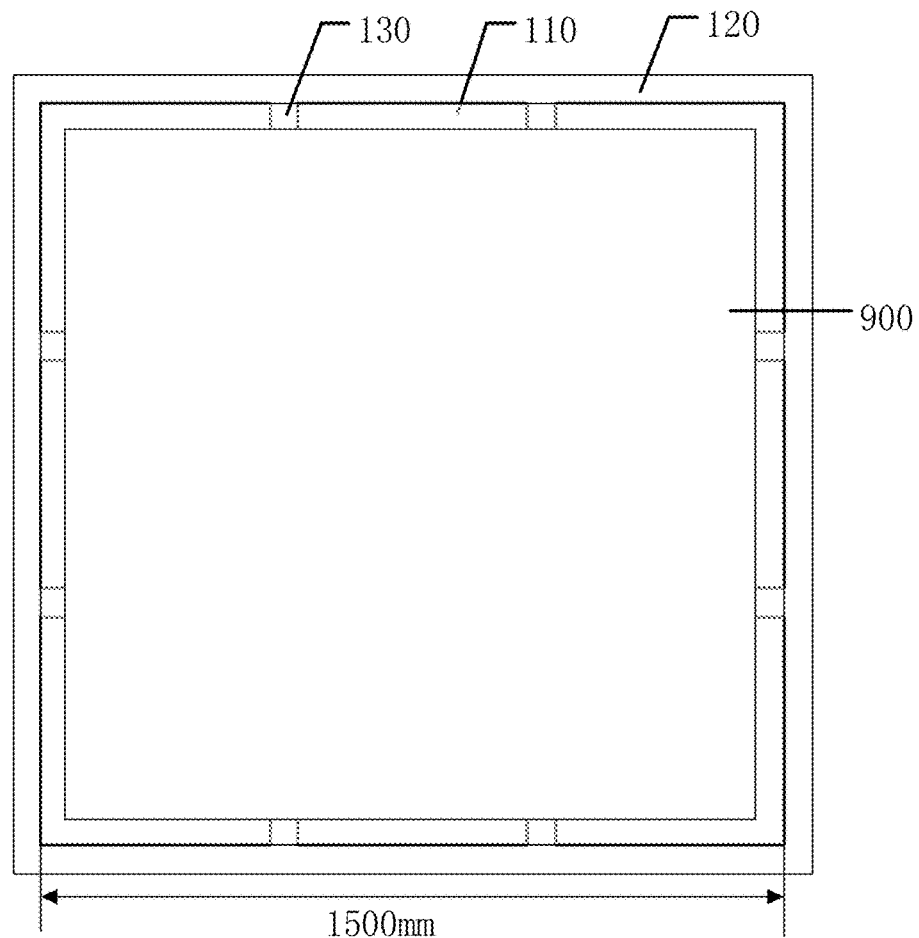
FIG. 5b is a planar schematic diagram of another carrying substrate provided by an embodiment of the present disclosure.

For example, FIGS. 5*a* and 5*b* are planar schematic diagrams of the carrying substrate as shown in FIG. 4. On the carrying platform provided by an example of the present embodiment, as shown in FIG. 5*a*, the carrying platform can further includes a worktable 120, and the plurality of sub-stands 110 are disposed on the worktable 120 in array. For example, as shown in FIG. 5*a*, nine sub-stands are disposed on the worktable 120 in array. As shown in FIG. 5*b*, the plurality of sub-stands 110 is disposed on the worktable 120, and the object to be exposed 900 is simultaneously disposed on the plurality of sub-stands 110. Therefore, the worktable can provide one work platform, and the plurality of sub-stands is disposed on the work platform. For example, the worktable can further include a lifting mechanism, thereby adjusting the heights of all sub-stands; for example, when an approaching exposure process is used, the object to be exposed can be conveyed to a predetermined height by the worktable, and then the heights and/or inclined angles of different portions of the object to be exposed can be finely adjusted by the plurality of sub-stands, thereby improving the uniformity of the exposure gaps between the different portions of the object to be exposed and the mask. Of course, the embodiment of the present disclosure includes but not limited thereto; the work platform is not indispensable and the carrying platform can be directly disposed on the ground.

For example, in the carrying platform provided by an example of the present embodiment, as shown in FIG. 5*a*, a distance between adjacent sub-stands 110 is smaller than $1/10$ of the size of the first carrying surface 1110 of each sub-stand 110 in a direction indicated by the arrow. Therefore, disadvantageous deformation caused by lack of support in positions between the adjacent sub-stands due to a larger distance between the sub-stands 110 can be avoided. Of course, the embodiment of the present disclosure includes but not limited thereto. The distance between the adjacent sub-stands can be set according to an actual condition (for example, the size and material of the object to be exposed).

For example, along with continuous development of a display technology, requirements of the market on large-sized display panels are more and more intense. Therefore, in the carrying platform provided by an example of the present embodiment, as shown in FIG. 5*b*, the first carrying surfaces 1110 of the plurality of sub-stands 110 can form a second carrying surface 130, and a size of the second carrying surface 130 is larger than 1 m$^2$. For example, as shown in FIG. 5*b*, the second carrying surface 130 is square and a side length of the second carrying surface 130 is 1.5 m. Therefore, the carrying platform provided by this example can be used for manufacturing the large-sized display panels, for example, manufacturing various color filter patterns on a color filter substrate. Besides, since the heights and/or inclined angles at different positions of the object to be exposed can be adjusted by the plurality of sub-stands to match with the deformation, caused by gravity, of the mask disposed on the object to be exposed, the uniformity of the exposure gaps at different positions of the object to be exposed is improved. Therefore, the carrying platform provided by this example has better precision and yield when manufacturing the large-sized display panels.

Figure 6:
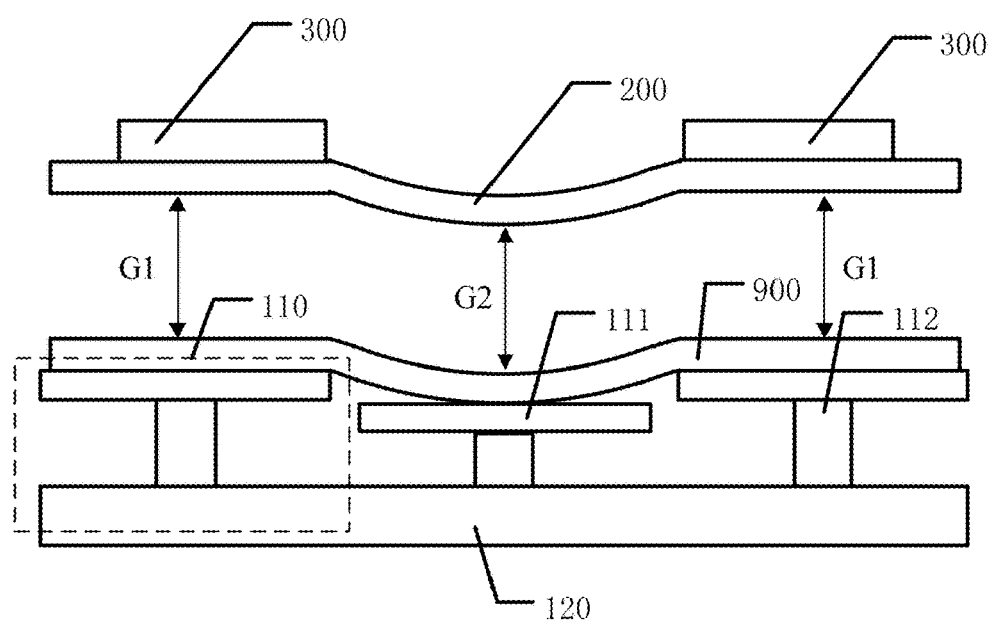
FIG. 6 is a schematic diagram that exposure gaps at different positions of an object to be exposed are improved by a plurality of sub-stands provided by an embodiment of the present disclosure.

For example, FIG. 6 shows a schematic diagram of using a plurality of sub-stands to improve the exposure gaps at different positions of the object to be exposed; as shown in FIG. 6, holders 300 are adsorbed on two ends of the mask 200 in a manner of vacuum adsorption; however, due to the gravity of the mask 200 per se, the mask 200 is bent to a certain extent. When the mask 200 above the object to be exposed 900 generates the deformation of two high sides and a low middle part due to the gravity per se, the heights at different positions of the object to be exposed 900 can be adjusted by the plurality of sub-stands 110, such that the object to be exposed 900 has two higher sides and a lower middle part. In this case, a difference between an exposure gap G2 at the middle position of the object to be exposed 900 and the exposure gaps G1 at two side positions of the object to be exposed 900 can be reduced or even eliminated, thereby improving uniformity of the exposure gaps at different positions of the object to be exposed, and further improving an exposure precision and the yield of a product. It should be noted that in order to clearly and simply explain a principle of improving the exposure gaps at different positions of the object to be exposed by using the plurality of sub-stands, the deformation of the mask in the present embodiment is exaggerated to a certain extent; in addition, the present embodiment merely shows nine sub-stands and merely adjusts the heights of the sub-stands; however, the embodiment of the present disclosure includes but not limited thereto, the number of the sub-stands can be set according to an actual condition; and except for adjustment on the heights of the sub-stands, the inclined angles of the sub-stands can be adjusted or the heights and the inclined angles of the sub-stands are adjusted simultaneously according to the deformation of the mask, thereby improving the uniformity of the exposure gaps at different positions of the object to be exposed.

Figure 7:
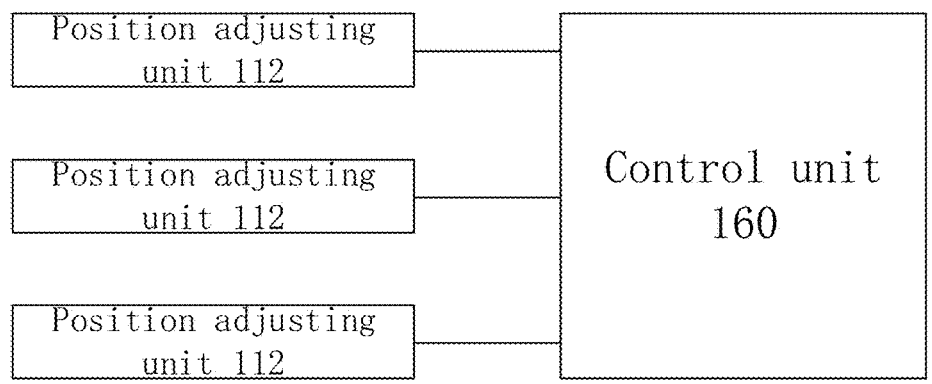
FIG. 7 is a schematic diagram of a control unit in a carrying platform provided by an embodiment of the present disclosure.

For example, in the carrying platform provided by one example of the present embodiment, the carrying platform can further comprise a control unit. FIG. 7 shows a schematic diagram of the control unit in a carrying platform, as shown in FIG. 7, the control unit 160 is in communication with the position adjusting units 112 of the plurality of sub-stands 110 respectively, and the control unit 160 can individually control the position adjusting unit 112 of each sub-stand 110. That is, the control unit 160 can individually control the position adjusting unit 112 of each sub-stand 110 to adjust the height and/or inclined angle. Therefore, the sub-stands can be controlled by the control unit. For example, the control unit can include a single chip, a computer, and other devices.

Figure 8:
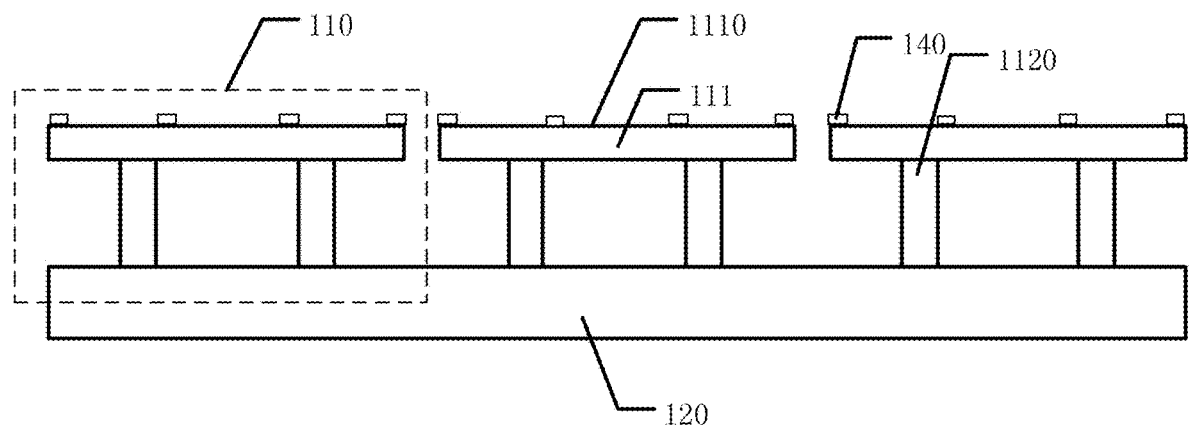
FIG. 8 is a structural schematic diagram of another carrying substrate provided by an embodiment of the present disclosure.

For example, FIG. 8 shows a structural schematic diagram of another carrying platform provided by the present embodiment. In the carrying platform provided by an example of the present embodiment, as shown in FIG. 8, the position adjusting unit 112 can include a platform lift mechanism 1120. The platform lift mechanism 1120 is configured for lifting up and down to adjust a height of the platform 111. For example, the platform lift mechanism 1120 can include an air cylinder, and of course, the embodiment of the present disclosure includes but not limited thereto.

For example, in the carrying platform provided by an example of the present embodiment, as shown in FIG. 8, the position adjusting unit 112 can include at least two platform lift mechanisms 1120. The platform lift mechanisms 1120 are disposed on the edge of the platform 111 and can be independently lifted up and down; that is, different platform lift mechanisms 1120 can be lifted up and down for a same height or different heights. By adjusting the lifting heights of the at least two platform lift mechanisms 1120 to be different, the platform 111 has different inclined angles, thereby realizing the adjustment on the inclined angles of the platform 111.

For example, in the carrying platform provided by an example of the present embodiment, as shown in FIG. 8, the platform 11 can also be provided with protrusions 140 to support the object to be exposed, and prevent the platform from adsorbing the object to be exposed, for example, a glass substrate to be exposed. For example, a material of the protrusions can include aluminum or aluminum alloy; of course, the embodiment of the present disclosure includes but not limited thereto.

The carrying platform provided by the present embodiment can be used for an exposure process in a photolithograph process. The object to be exposed, for example, a substrate to be exposed, can be placed on the first carrying surfaces of the plurality of sub-stands; the mask is disposed on the side of the substrate to be exposed away from the carrying platform, for example, the holders are configured to vacuum-adsorb the mask to dispose the mask above the object to be exposed; and the heights and/or inclined angles of the plurality of sub-stands are respectively adjusted by the position adjusting units such that the gaps between different positions of the object to be exposed and the mask are uniform in distribution, for example, the height of the sub-stand corresponding to a position where the mask droops due to gravity is reduced to match with downward deformation of the mask generated by gravity, or the heights of the sub-stands corresponding to other positions except for the position where the mask droops due to gravity are increased to match with the downward deformation of the mask generated by gravity, thereby improving a precision and yield of exposure patterns generated by the exposure process.

Embodiment 2

Figure 9:
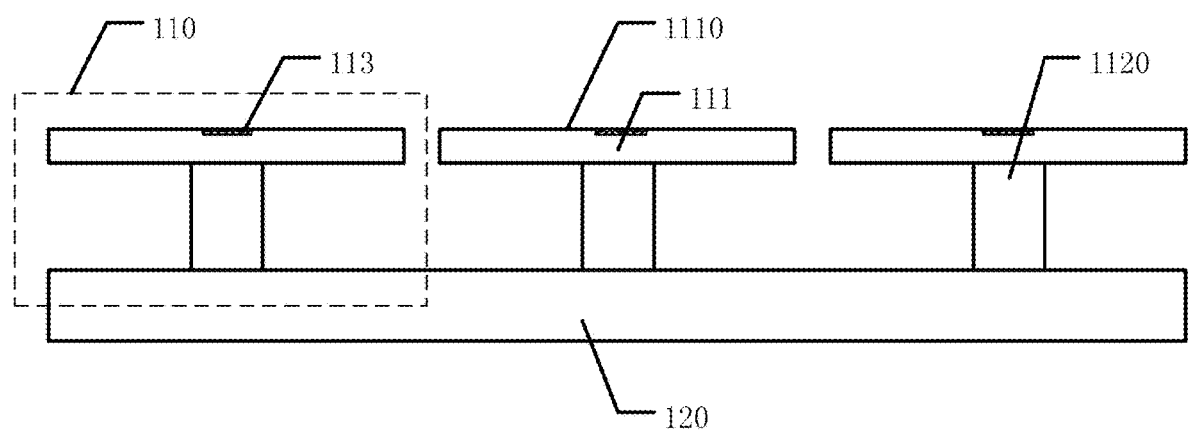
FIG. 9 is a structural schematic diagram of yet another carrying substrate provided by an embodiment of the present disclosure.

Based on the embodiment 1, the present embodiment provides a carrying platform. FIG. 9 shows a structural schematic diagram of a carrying platform provided by the present embodiment. As shown in FIG. 9, each sub-stand 110 can further include at least one distance detecting unit 113 disposed on the platform 111. The distance detecting unit 113 can detect an exposure gap between the mask and the portion of the object to be exposed locating at the distance detecting unit 113. Therefore, exposure gap between the mask and the portion of the object to be exposed locating at the distance detecting unit 113 can be detected by the distance detecting unit, such that the position adjusting unit of the sub-stand is controlled according to the detected exposure gap to adjust the height and/or inclined angle of the platform. In addition, the distance detecting units can be communicatively connected to the control unit, such that the heights and/or inclined angles of different portions of the object to be exposed can be automatically adjusted to improve uniformity of the exposure gaps at different positions of the object to be exposed.

Figure 10:
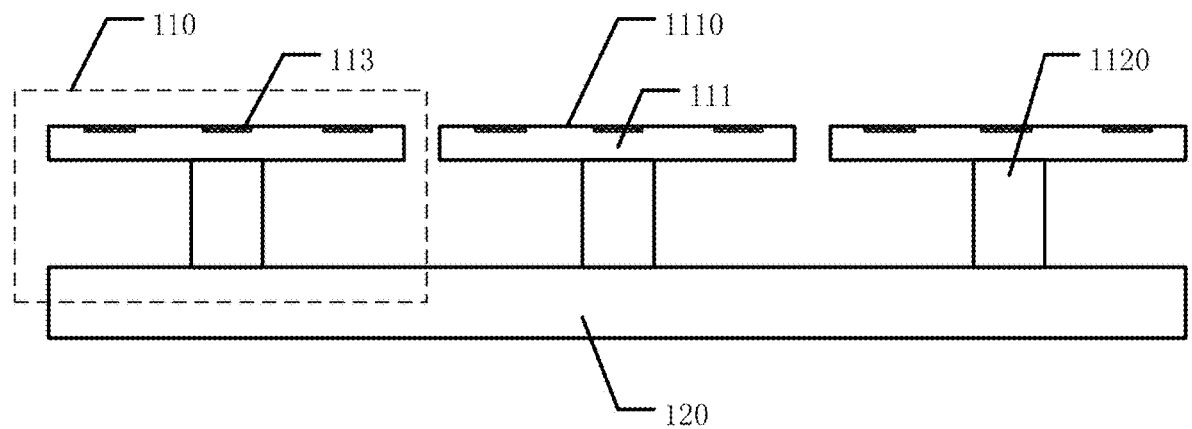
FIG. 10 is a structural schematic diagram of still another carrying substrate provided by an embodiment of the present disclosure.

For example, the number of the distance detecting unit on each sub-stand includes but not limited to one. FIG. 10 shows a structural schematic diagram of another carrying platform provided by the present embodiment. As shown in FIG. 10, each sub-stand can include three distance detecting units 113. When a plurality of distance detecting units 113 are disposed on each sub-stand, it is convenient to adjust the inclined angle of the platform according to the exposure gaps detected by different distance detecting units on the same sub-stand. It should be noted that specific positions of the distance adjusting units can be set according to an actual condition, which is not limited by the embodiment of the present disclosure. In addition, the carrying platform may be not provided with the distance detecting units, which is not limited by the embodiment of the present disclosure; for example, the exposure gaps at different positions of the object to be exposed lying on the carrying platform can be measured by adopting other distance measuring manners or devices.

When the carrying platform provided by the present embodiment is used for an exposure process in a photolithograph process, the gaps, i.e., the exposure gaps, between the mask and the portions of the object to be exposed locating at the distance detecting units 113, can be measured by the above distance detecting units; and the position adjusting units of the plurality of sub-stands can be controlled according to the gaps measured by the distance detecting units to adjust the heights and/or inclined angles of the plurality of sub-stands, such that the gaps between the object to be exposed and the mask at different positions of the object to be exposed are uniform in distribution.

Embodiment 3

Figure 11A:
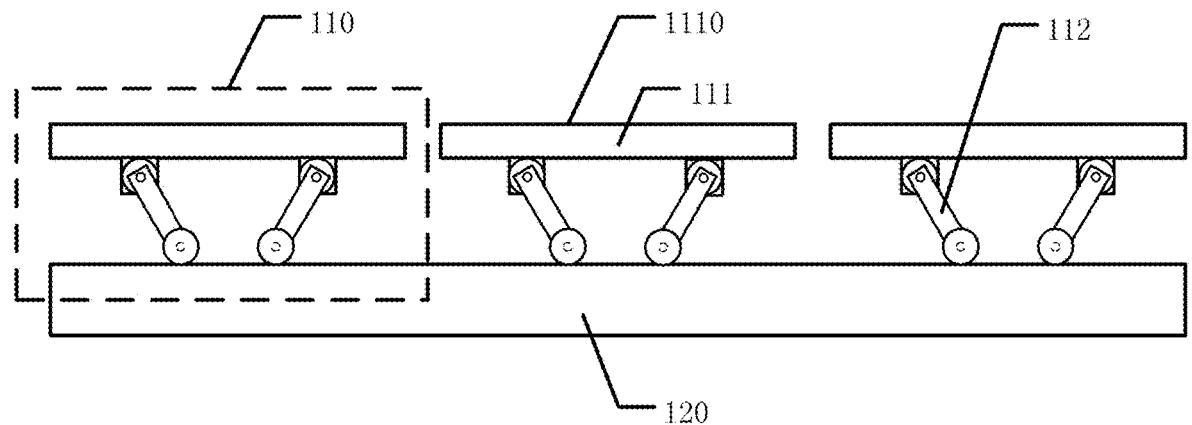
FIG. 11a is a structural schematic diagram of still another carrying substrate provided by an embodiment of the present disclosure.
Figure 11B:
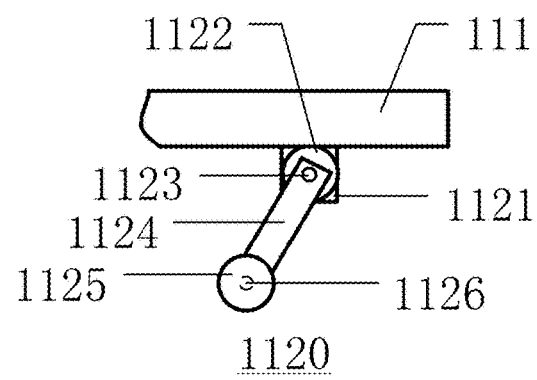
FIG. 11b is a structural schematic diagram of a platform lift mechanism in a carrying substrate provided by an embodiment of the present disclosure.

Based on the embodiment 1, the present embodiment provides a carrying platform. FIG. 11a shows a structural schematic diagram of a carrying platform provided by the present embodiment, and FIG. 11b shows a structural schematic diagram of a platform lift mechanism provided by the present embodiment. As shown in FIG. 11a, the platform lift mechanism 120 is disposed on a side of the platform 111 away from the first carrying surface 1110, and one end thereof is fixedly connected to the platform 111. As shown in FIG. 11b, the platform lift mechanism 1120 includes a fixing part 1121, a rotary mechanism 1122, a connecting rod 1124 and a roller 1125. The fixing part 1121 is fixedly disposed on the side of the platform 111 away from the first carrying surface 1110, the rotary mechanism 1122 includes a rotary shaft 1123, and the roller 1125 has a bearing 1126. One end of the connecting rod 1124 is fixedly connected to the bearing 1123 and can move along an arc line along with the rotary shaft 1123, and the other end of the connecting rod 1124 is fixedly connected to the bearing 1126. Therefore, the rotary mechanism 1122 can drive the connecting rod 1124 to move along an arc line by the rotary shaft 1123, thereby driving the roller 1125 to move in a horizontal direction, and further realizing lifting of the platform 111.

For example, in the carrying platform provided by an example of the present embodiment, the rotary mechanism can include an electromotor.

Embodiment 4

Figure 12:
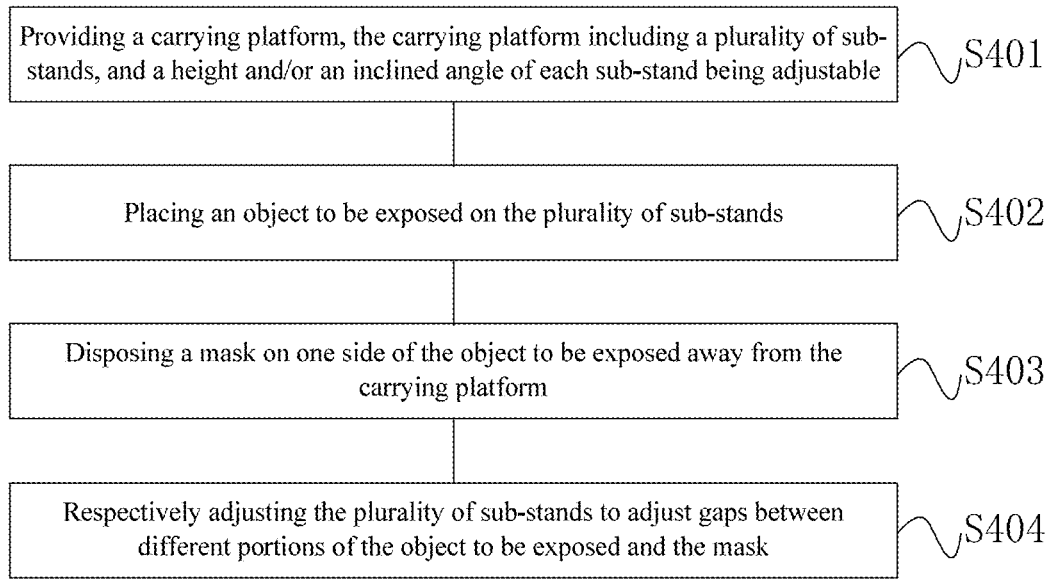
FIG. 12 is a flowchart of an exposure method provided by an embodiment of the present disclosure.

The present embodiment provides an exposure method. FIG. 12 shows a flowchart of the exposure method provided by the present embodiment. As shown in FIG. 12, the exposure method includes steps S401 to S404.

S401: providing a carrying platform, the carrying platform including a plurality of sub-stands, and a height and/or an inclined angle of each sub-stand being adjustable.

For example, the carrying platform can be the carrying platform described in any one of the above embodiments 1 to 3.

S402: placing an object to be exposed, for example, a substrate to be exposed, on the plurality of sub-stands.

For example, the object to be exposed can be a color filter substrate in a liquid crystal display panel. Of course, the embodiment of the present disclosure includes but not limited thereto, and the object to be exposed can also be an array substrate in the liquid crystal display panel or other substrates needing to be exposed.

S403: disposing a mask on one side of the object to be exposed away from the carrying platform. It should be noted that the mask and the object to be exposed are disposed to be spaced apart.

Herein, a distance, in a direction perpendicular to one of the first carrying surfaces, between the mask and a portion of the object to be exposed is called exposure gap or gap, wherein the portion of the object to be exposed is located directly above the one of the first carrying surfaces.

For example, when the object to be exposed is a color filter substrate, the mask can be a mask including color filter patterns.

S404: respectively adjusting the plurality of sub-stands to adjust gaps, i.e., the exposure gaps, between the mask and different portions of the object to be exposed.

In the exposure method provided by the present embodiment, the exposure gaps at different positions of the object to be exposed can be adjusted by adjusting a plurality of sub-stands so as to match with deformation of the mask caused by gravity, thereby improving uniformity of the exposure gaps at different positions of the object to be exposed and further improving an exposure precision and a product's yield.

For example, in the exposure method provided by an example of the present embodiment, the step S404, i.e., respectively adjusting the plurality of sub-stands to adjust gaps between the mask and the different portions of the object to be exposed can include: measuring the gaps between the mask and the different portions of the object to be exposed; and respectively adjusting heights and/or inclined angles of the plurality of sub-stands to enable a difference value between the gaps between the mask and the portions of the object to be exposed respectively locating at adjacent measuring positions to be smaller than 20 μm, and to enable a difference value between the gaps between the mask and the object to be exposed at all measuring positions to be smaller than 40 μm. Hence, by measuring and adjusting the gaps between the object to be exposed and the mask at different measuring positions of the object to be exposed, the uniformity of the exposure gaps at different positions on the exposure object is improved. It should be noted that the above measuring positions can be positions where the distance detecting units disposed on the sub-stands are, which can specifically refer to related description in Embodiment 2, and is not repeated herein. Of course, the embodiment of the present disclosure includes but not limited thereto, and the measuring positions can also be positions selected by adopting other measuring manners.

For example, the exposure method provided by an example of the present disclosure can also includes: performing an exposure with the mask; measuring a deviation value of an exposure pattern, for example a deviation value of critical dimensions, formed on the object to be exposed after the exposure; calculating an adjusting corrected value of the plurality of sub-stands according to the deviation value; and respectively readjusting the heights and/or inclined angles of the plurality of sub-stands according to the adjusting corrected value to improve uniformity of the gaps between the object to be exposed and the mask at different positions of the object to be exposed. That is, after the step S404, that is, respectively adjusting the plurality of sub-stands to adjust gaps between the mask and different portions of the object to be exposed, is executed, an exposure test can be performed by the mask and the adjusting corrected value can be calculated by the deviation value of an exposure result, for example, the deviation value of the critical dimensions, and then the distribution uniformity of the gaps between the object to be exposed and the mask is further improved by adjusting the heights and/or inclined angles of the plurality of sub-stands according to the above adjusting corrected value. Hence, in one aspect, the uniformity of the gaps between the object to be exposed and the mask at different positions of the object to be exposed can be improved by the secondary adjustment; in the other aspect, a case of large-batch unqualified products caused by unfulfilled execution of the step S404 of faults of related devices can be avoided, thereby improving safety of the exposure method. Particularly, when the exposure method adopts an automatic carrying platform, the case of the large-batch unqualified products caused by faults of the related device or the control unit can be avoided, thereby improving the safety of such exposure method.

For example, the exposure method provided by an example of the present embodiment can further includes: recording an adjusting value of the plurality of sub-stands before performing the exposure with the mask; recording the adjusting corrected value; and respectively exposing a plurality of objects belonging to a same batch as the object to be exposed according to the adjusting value and the adjusting corrected value. That is, after the adjusting value and the adjusting corrected value for the objects to be exposed in the same batch are determined, and after the exposure process, other subsequent objects to be exposed belonging to the same batch need no complex steps, and the determined adjusting value and adjusting corrected value are directly used to adjust the heights and/or inclined angles of respective sub-stands, thereby exposing other objects to be exposed belonging to the same batch. Hence, process steps are saved, and exposure efficiency is greatly improved.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The foregoing is only the embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

The invention claimed is:

1. A carrying platform, comprising:
   a plurality of sub-stands, configured to co-carry an object;
   wherein each sub-stand includes:
      a platform, having a first carrying surface; and
      a position adjusting unit, disposed on a side of the platform away from the first carrying surface and configured to adjust inclined angle of the platform,
   the carrying platform further comprise:
   a control unit, in communication with the position adjusting units of the respective plurality of sub-stands;
   wherein the control unit is configured to control the position adjusting unit of the respective sub-stands.

2. The carrying platform according to claim 1, wherein each sub-stand further includes:
   at least one distance detecting unit, disposed on the platform.

3. The carrying platform according to claim 1, further comprising:
   a worktable,
   wherein the plurality of sub-stands are disposed on the worktable in array.

4. The carrying platform according to claim 1, wherein, in a plan view of the carrying platform, a distance between adjacent sub-stands is smaller than 1/10 of a size of the first carrying surface of each sub-stand in a direction.

5. The carrying platform according to claim 1, wherein, in a plan view of the carrying platform, the first carrying surfaces of the plurality of sub-stands form a second carrying surface, and a size of the second carrying surface is larger than 1 m$^2$.

6. The carrying platform according to claim 1, wherein, the position adjusting unit includes:
   at least one platform lift mechanism, configured to be lift up and down to adjust at least one of height or inclined angle of the platform.

7. The carrying platform according to claim 6, wherein, the at least one platform lift mechanism includes two or more platform lift mechanisms, disposed on an edge of the platform,
   wherein, the two or more platform lift mechanisms are operable independently.

8. The carrying platform according to claim 6, wherein the at least one platform lift mechanism includes an air cylinder.

9. The carrying platform according to claim 6, wherein the at least one platform lift mechanism includes:
   a fixing part, fixedly disposed on a side of the platform away from the first carrying surface;
   a rotary mechanism, including a rotary shaft;
   a connecting rod;
   a roller, having a bearing;
   wherein the rotary mechanism is disposed on the fixing part, one end of the connecting rod is fixedly connected to the rotary shaft and configured to move along an arc line along with the rotary shaft, and the other end of the connecting rod is fixedly connected to the bearing.

10. The carrying platform according to claim 9, wherein the rotary mechanism includes an electromotor.

11. The carrying platform according to claim 2, further comprising:
    a worktable,
    wherein the plurality of sub-stands are disposed on the worktable in array.

12. The carrying platform according to claim 2, wherein, in a plan view of the carrying platform, a distance between adjacent sub-stands is smaller than 1/10 of a size of the first carrying surface of each sub-stand in a direction.

13. The carrying platform according to claim 2, the first carrying surfaces of the plurality of sub-stands form a second carrying surface, and
    in a plan view of the carrying platform, a size of the second carrying surface is larger than 1 m$^2$.

14. The carrying platform according to claim 2, the position adjusting unit includes:
    at least one platform lift mechanism, configured to be lift up and down to adjust at least one of height or inclined angle of the platform.

15. An exposure method, comprising:
    providing a carrying platform including a plurality of sub-stands, configured to co-carry an object; wherein each sub-stand includes: a platform, having a first carrying surface and a position adjusting unit, disposed on a side of the platform away from the first carrying surface and configured to adjust inclined angle of the platform, and the carrying platform further comprise: a control unit, in communication with the position adjusting units of the respective plurality of sub-stands, wherein the control unit is configured to control the position adjusting unit of the respective sub-stands;
    placing an object to be exposed on the first carrying surface of the plurality of sub-stands;
    disposing a mask on a side of the object to be exposed away from the carrying platform; and
    controlling the position adjusting unit of at least one of the sub-stands by the control unit to adjust the inclined angle of the platform so as to adjust a gap between the mask and a portion of the object to be exposed.

16. The exposure method according to claim 15, wherein, controlling the position adjusting unit of at least one of the sub-stands by the control unit to adjust the inclined angle of the platform so as to adjust a gap between the mask and a portion of the object to be exposed includes:
    measuring the gaps between the mask and portions of the object to be exposed which are located at measuring positions respectively; and
    adjusting at least of height or inclined angle of the at least one of the sub-stands to enable a difference value between the gaps between the mask and the portions of the object to be exposed which are located at adjacent two of the measuring positions to be smaller than 20 μm, and to enable a difference value between the gaps between the object to be exposed and the mask at all the measuring positions to be smaller than 40 μm.

17. The exposure method according to claim 16, further comprising:
    performing an exposure with the mask;
    measuring a deviation value of an exposure pattern formed on the object to be exposed after the exposure;
    calculating an adjusting corrected value of the at least one of the sub-stands according to the deviation value; and
    adjusting at least one of height or inclined angle of the at least one of the sub-stands according to the adjusting corrected value to improve uniformity of the gaps between the mask and the respective portions of the object to be exposed.

18. The exposure method according to claim 17, further comprising:
    recording an adjusting value of the plurality of sub-stands before performing the exposure with the mask;
    recording the adjusting corrected value; and respectively exposing a plurality of objects belonging to a same batch as the object to be exposed according to the adjusting value and the adjusting corrected value.

\* \* \* \* \*